United States Patent [19]

Allam

[11] Patent Number: 5,512,763
[45] Date of Patent: Apr. 30, 1996

[54] METAL-SEMICONDUCTOR-METAL PHOTODETECTOR

[75] Inventor: Jeremy Allam, Cambridge, United Kingdom

[73] Assignee: Hitachi, Ltd., Tokyo, Japan

[21] Appl. No.: 321,645

[22] Filed: Oct. 11, 1994

[30] Foreign Application Priority Data

Oct. 28, 1993 [GB] United Kingdom ................... 9322246

[51] Int. Cl.⁶ ...................... H01L 29/06; H01L 31/0328; H01L 31/0336
[52] U.S. Cl. ........................... 257/21; 257/184; 257/457; 257/459
[58] Field of Search ............................. 257/21, 184, 457, 257/459

[56] References Cited

U.S. PATENT DOCUMENTS 4,998,154  3/1991  Surridge et al. .......................... 357/30

FOREIGN PATENT DOCUMENTS 5235991  3/1977  Japan ..................................... 257/459
1283882  11/1989 Japan ..................................... 257/459

OTHER PUBLICATIONS

Nakajima et al, "Properties and Design Theory of Ultrafast GaAs Metal–Semiconductor–Metal Photodetector with Symmetrical Schottky Contacts," IEEE Transactions on Electron Devices, vol. 37, No. 1, Jan. 1990, pp. 31–35.
Optical Technology for Microwave Applications VI and Optoelectronic Signal Processing for Phased–Array Antennas III, Orlando, FL. USA, 20–23 Apr. 1992, ISSN 0277–786X, Proceedings of the SPIE–The International Society for Optical Engineering, 1992, USA, pp. 313–320, Litvin K. I. et al.: *High–Speed MSM Photodetectors for Millimeter Waves*.
Patent Abstracts of Japan, vol. 11, No. 61 & JP–A–61 220 381 (Fujitsu Ltd) 30 Sep. 1986.
IEEE Journal of Quantum Electronics, vol. 27, No. 3, (1991) pp. 737–752, Julian B. D. Soole and Hermann Schumacher: *InGaAs Metal–Semiconductor–Metal Photodetectors for Long Wavelength Optical Communication*.
IEEE Transactions on Electron Devices, vol. 37, No. 11, pp. 2285–2291 (1990); Julian B. D. Soole and Hermann Schumacher: *Transit–Time Limited Frequency Response of InGaAs MSM Photodetectors*.
Appl. Phys. Lett. 61 (7), 17 Aug. 1992, S. Y. Chou, Y. Liu, W. Khali, T. Y. Hsiang & S. Alexandrou, pp. 819–821: *Ultrafast nanoscale metal–semiconductor–metal photodetectors on bulk and low–temperature grown GaAs*.
Appl. Phys. Lett. 58 (17), 29 Apr. 1991, M. Lambsdorf, J. Kuhl, J. Rosenzweig, A. Axmann & Jo. Schneider, pp. 1881–1881: *Subpicosecond carrier lifetimes in radiation–damaged GaAs*.
Appl. Phys. Lett. 59 (25), 16 Dec. 1991, S. Gupta, M. Y. Frankel, J. A. Valdmanis, J. F. Whitaker and G. A. Mourou, pp. 3276–3278: *Subpicosecond carrier lifetime in GaAs grown by molecular beam epitaxy at low temperatures*.
J. Vac. Sci. Technol. B 8 (2), Mar./Apr. 1990, A. Chin and T. Y. Chang: pp. 339–342: *Multilayer reflectors by molecular–beam epitaxy for resonance enhanced absorption in thin high–speed detectors*.

(List continued on next page.)

*Primary Examiner*—William Mintel
*Attorney, Agent, or Firm*—Kenyon & Kenyon

[57] ABSTRACT

A metal-semiconductor-metal (MSM) device comprises interdigitated metal electrodes (2, 3) on a semiconductor substrate (1). When embodied as a photoconductor, a photoconductive region (4) is bounded by layers (5, 6) which form a resonant cavity for incoming radiation to improve the response. In another embodiment, which can be either a photodiode or photoconductor, the electrodes are arranged to extend into the thickness of the photoresponsive layer (4). To reduce sensitivity to polarization, the electrodes may be arranged in sets extending in mutually transverse directions. Groups of the electrodes may be connected so as to be sensitive to polarization but substantially insensitive to the amplitude of incoming radiation.

20 Claims, 6 Drawing Sheets

OTHER PUBLICATIONS

IEEE Journal of Quantum Electronics, vol. 27, No. 8, (1991) pp. 2025–2034, K. Kishino, M. S. Unlu, J. Chyi, J. Reed, L. Arsenault and H. Morkoc: *Resonant Cavity–Enhanced (RCE) Photodetectors*.

Electronics Letters, vol. 27, No. 23, 7 Nov. 1991, pp. 2125–2127; A. G. Dentai, R. Kuchibholta, J. C. Campbell, C. Tsai and C. Lei, "High Quantum Efficiency, Long Wavelength InP/InGaAs Microcavity Photodiode".

Appl. Phys. Lett. 62 (2), 11 Jan. 1993, U. Prank, M. Mikulla and W. Kowalsky, pp. 129–133: *Metal–semiconductor–metal photodetector with integrated Fabry–Perot resonator for wavelength demultiplexing high bandwidth receivers*.

Appl. Phys. Lett. 58 (13), 1 Apr. 1991, M. Lambsdorf, M. Klingenstein, J. Kuhl. C. Moglestue, J. Rosenzweig, Jo. Schneider, A. Hulsmann, H. Leier and A. Forchel: *Subpicosecond characterization of carrier transport in GaAs–metal–semiconductor–metal photodiodes*.

▨ ELECTRODE A   ── INTERELECTRODE INSULATION
▨ ELECTRODE B

▨ ELECTRODE A  ═══ INTERELECTRODE INSULATION
▨ ELECTRODE B 5,512,763

METAL-SEMICONDUCTOR-METAL PHOTODETECTOR

FIELD OF THE INVENTION

This invention relates to an improved metal-semiconductor-metal (MSM) photodetector device.

BACKGROUND TO THE INVENTION

Planar interdigitated electrode MSM photodetectors offer high bandwidths and responsivity, and are therefore attractive for optoelectronic integrated circuits for optical communication, and for ultra fast optical sampling measurements. The planar structure leads to low parasitic capacitance, with consequent improvements in both bandwidth and receiver sensitivity and very easy integration with FETs such as MES FETs or HEMTs.

A typical device structure is shown in FIG. 1 and consists of two sets of interdigitated electrodes 2 and 3 formed by vapor deposition and lithography, on a semiconductor sample. The electrode sets are biased with respect to each other, so that alternate electrodes e.g. 2 and 3 of the sets are at bias +V,−V etc. The width of each electrode is w and the gap between the electrodes is d. To understand the present invention, it is necessary to draw a clear distinction between photodiodes and photoconductors. These are similar structures but operate in different ways.

In a photodiode, contacts are evaporated onto an undoped semiconductor with no subsequent annealing process, thereby forming Schottky or blocking contacts. As is well known in the art, Schottky contacts function as diodes, producing a depletion region in the semiconductor. In use, a reverse bias is applied so that charge carriers formed in the depletion region of the semiconductor by incident photons, are swept rapidly to the electrodes 2 and 3. The bandwidth and responsivity of the device are limited by the transit time for the carriers. The internal quantum efficiency (collection efficiency) is almost unity since the carrier lifetime ($\tau_r \approx 10^{-9}$s in GaAs) is much longer than the charge carrier transit times, for typical electrode separations of a few microns or less. Thus, the response time is determined by the transit time, which is $\tau_d \approx 10$ ps for a drift velocity of $10^5$ m.s$^{-1}$ and contact separations=1 µm. The properties of MSM photodiodes have been previously studied in detail. For a review of InGaAs MSM photodiodes for optical communications, see B. D. Soole and H. Schumacher, IEEE J. Quantum Electron. QE-27, 737 (1991) "InGaAs metal-semiconductor-metal photodetectors for long- wavelength communication", IEEE Trans. Electron Devices 37, 2285 [1990] "Transit-time limited frequency response of InGaAs MSM photodetectors". A GaAs MSM photodiode with w=d=0.1 µm showed a measured full-width-at-half-maximum (FWHM) response time of 1.5 ps, limited by the parasitic capacitance—S. Y. Chou, Y. Liu, W. Khali, T. Y. Hsiang & S. Alexandrou, Appl. Phys. Lett. 61, 819 [1992] "Ultrafast nanoscale metal-semiconductor-metal photodetectors on bulk and low temperature GaAs".

In contrast, in a photoconductor, the response time is limited by the recombination time $\tau_r$ of the charge carrier pairs produced by incident light, rather than by the transit time $\tau_d$ as in the case of a photodiode. This situation occurs for an ultrafast photoconductive material where the carrier recombination time is shorter than the transit time between the electrodes, and is irrespective of whether the electrodes form Schottky (blocking) contacts or Ohmic (injecting) contacts. Carrier recombination lifetimes of a few picoseconds or less are required for recombination-limited behaviour in a GaAs device with 1 µm electrode separation. The carrier recombination lifetime may be reduced to less than 1 ps by, for example, proton implantation or low-temperature growth of GaAs with As precipitates (LT GaAs or GaAs:As) see M. Lambsdorf, J. Kuhl, J. Rosenzweig, A.Axmann & Jo. Schneider, Appl. Phys. Lett. 58, 1881 [1991]"Subpicosecond carrier lifetimes in radiation-damaged GaAs", and S.Gupta, M. Y. Frankel, J. A. Valdmanis, J. F. Whittaker, G. A. Mourou, F. W. Smith and A. R. Calewa, "Subpicosecond carrier lifetime in GaAs grown by molecular beam epitaxy at low temperatures", Appl. Phys. Lett 59 3276 [1991]. The responsivity is reduced by a factor ($\tau_r/\tau_d$) since only a portion of the carriers reach the contacts before recombining (the photoconductive gain is less than unity), giving a responsivity which scales with (1/d). The responsivity can therefore be increased by reducing d until $\tau_r \approx \tau_d$ (d≈0.1 µm for 1 ps carrier lifetime). Referring now to FIG. 2, this shows a section through the arrangement of FIG. 1, and in this discussion, is considered to be configured as a photodiode. The substrate 1 includes an absorption layer 4 of thickness h in the substrate 1 beneath the electrodes 2 and 3, the absorption layer 4 being the region in which incident optical radiation is absorbed to produce charge carrier pairs. The field between the adjacent electrodes 2 and 3 is shown in the absorption layer. The field is reduced far from the electrodes 2 and 3. For low applied fields, the steady-state velocity for charge carriers produced in the absorption layer 4, is proportional to the field, and hence the charge carrier velocity is decreased for carriers generated deep within the absorption layer. Also, the distance the carriers need to travel to the electrodes is increased. This can lead to reduced bandwidths for MSM photodiodes, giving a long tail in the response to a short duration light pulse. The absorption coefficient for above-bandgap illumination in direct gap III–V semiconductors is typically $\approx 10^6$m$^{-1}$, so that the absorption layer thickness h must normally be several µm for high responsivity, whereas d must be <1 µm for picosecond transit times. Soole and Schumacher supra have investigated InGaAs MSM photodiodes where h was decreased from 3µm to 0.5µm, and the responsivity decreased and the bandwidth increased as expected. A prior method of improving bandwidth of MSM photodiodes will now be described with reference to FIG. 3. The absorption layer 4 is arranged as a thin layer confined between layers 5, 6 that define an optical cavity. Thus, light incident on the device, resonates between the layers 5 and 6 so as to produce multiple reflections of the light through the absorption layer. As a result, the absorption layer can be made thinner than the arrangement shown in FIG. 2, and close to the electrodes 2 and 3 so as to be disposed in the relatively high, uniform field. —see A. 25 Chi and T. Y. Chang, J. Vac. Sci. Technol. B 8, 399 [1990]; K. Kishino, M. S. Unlu, J. Chyi, J. Reed, L. Arsenault and H. Morkoc, IEEE J.Quantum Electronics JQE-27, 2025 [1991]; A. G. Dentai, R. Kuchibhotla, J. C. Campbell, C. Tsai and C. Lei, Electron Lett. 27, 2125 [1991]; U. Prank, M/Mikulla and W. Kowalsky, Appl. Phys. Lett 62, p.129 [1993].

SUMMARY OF THE INVENTION

The present invention makes use of our discovery that surprisingly, for photoconductors, the absorption length and field penetration length have significant consequences for the performance of the photodetector. Hitherto, since the properties were considered primarily to be determined by recombination time for the carriers rather than the transit time, it had been thought that expedients such as shown in FIG. 3 would not have application to photoconductors. Surprisingly, this is not the case.

We have appreciated that the reduced field experienced by carriers photogenerated deep within the absorption leads to a reduced contribution of these carriers to the current and hence a decreased responsivity of the photoconductor. The impulse response of a photoconductor is given by Ramo's theorem, where the instantaneous response to a short light pulse at t=o is $$i = \sum_{j=1}^{N} (q_j \cdot v_j \cdot F_j/\Phi)$$

where $v_j$ is the instantaneous velocity of carrier j at position $r_j$, $q_j$ is the charge, $F_j=F(r_j)$ is the field at $r_j$, $\Phi=2,V$ is the potential difference between the contacts and N is the number of carriers generated. Hence carriers which experience a small field will contribute less to the photocurrent. Assuming steady-state transport, vj=vj(Fj) is known. Hence the instantaneous pulse response at t=0 (i.e. the peak height) can be calculated if $F(r_j)$ and the initial photocarrier distribution are known. $F(r_j)$ can be calculated using conformal mapping techniques and the photocarrier distribution can be assumed to obey Beer's law within the photoconductive gap;

$$N(z)=N_o.\exp(=\alpha z).$$

where z is the distance from the incident surface and α is the absorption coefficient. Making these assumptions, the calculated peak height is shown in FIG. 4a, for the case where v is equal to the saturated drift velocity. The photoconductive gap d was varied between 0.05 and 100 μm, the electrode width w was equal to the gap width, and the absorption coefficient was 1.8 μm$^{-1}$ (appropriate for GaAs and light of wavelength 800 nm). For gap Widths d large compared to the absorption length (i.e. >several μm) the pulse height scales with (1/d). However, for small widths the pulse height approaches a constant. For small gap widths the bandwidth is limited by the parasitic capacitance which scales as d. FIG. 4b ) shows the responsivity-bandwidth product in this regime. The product decreases for small photoconductive gaps due to the low field experienced by the photogenerated carriers, leading to poor performance.

This work leads us to understand that surprisingly, the production of charge carriers in response to incident light, deep in an adsorption layer under conditions of low field will in fact degrade the performance of a MSM photoconductor. To overcome this problem the present invention provides in a first aspect an optical resonant cavity in combination with a MSM photoconductor device.

And, in accordance with the invention from this first aspect there is provided a MSM photoconductor device comprising:

a photoconductive region for generating charge carriers in response to incoming optical radiation, an array of electrodes for applying an electric field to the photoconductive region so as to collect charge carriers produced in response to the incoming radiation, and means defining an optical resonant cavity containing the photoconductive region, whereby incoming optical radiation resonates in the cavity to generate said carriers.

Preferably, the device includes a substrate, the photoconductive region comprising a layer overlying the substrate, the cavity being defined by first and second optical reflective layers on opposite sides of the photoconductive layer, and the array of electrodes comprising first and second sets of interdigitated electrodes overlying the conductive layer.

In accordance with a second aspect of the invention, an electrode structure is provided which produces an improved uniform field in the photoresponsive material that produces charge carriers in response to incoming radiation.

In accordance with the invention from this second aspect, there is provided a MSM detector device comprising a substrate, a photoconductive layer overlying the substrate for generating charge carriers in response to incoming radiation, and electrode means to receive carriers from the photoconductive layer produced by the incoming radiation, said electrode means comprising electrically conductive regions extending into the thickness of the photoconductive layer for establishing an electric field through the layer between the conductive regions. The conductive regions may form Schottky or Ohmic with the photoconductive layer Our work with MSM devices has also resulted in the discovery that prior devices with generally parallel arrays of interdigitated electrodes, exhibit a polarisation sensitivity to incoming light. Thus, if the polarisation direction of incoming light varies, the response of the MSM device varies in accordance with the direction of polarisation. This gives rise to difficulties since the output of the device cannot be calibrated unless the polarisation of the incoming light is known.

To overcome this problem the present invention provides in a third aspect a MSM detector device comprising a photoresponsive region for generating charge carriers in response to incoming optical radiation, and electrode means to receive carriers from the photoresponsive region produced by the incoming radiation, said electrode means comprising first and second interdigitated sets of electrodes, the electrodes of at least one of the sets including portions which extend in mutually transverse directions whereby to desensitise the response of the device to the polarisation of the incoming radiation.

Preferably, the electrodes of each set thereof each include a portion extending in a first direction and a portion extending in a second orthogonal direction.

Also, in some circumstances, it is desirable to detect the polarisation of incoming radiation, independently of its amplitude.

In a fourth aspect, the invention provides a MSM detector device comprising: a photoresponsive region for generating charge carriers in respect to incoming radiation, and electrode means to receive carriers from the photoresponsive region produced by the incoming radiation, said electrode means comprising a plurality of sets of interdigitated electrodes interconnected to provide an output which is sensitive to the polarisation of incoming radiation but substantially insensitive to the intensity thereof at least over a given intensity range.

DESCRIPTION OF PREFERRED EMBODIMENTS

Figure 3:
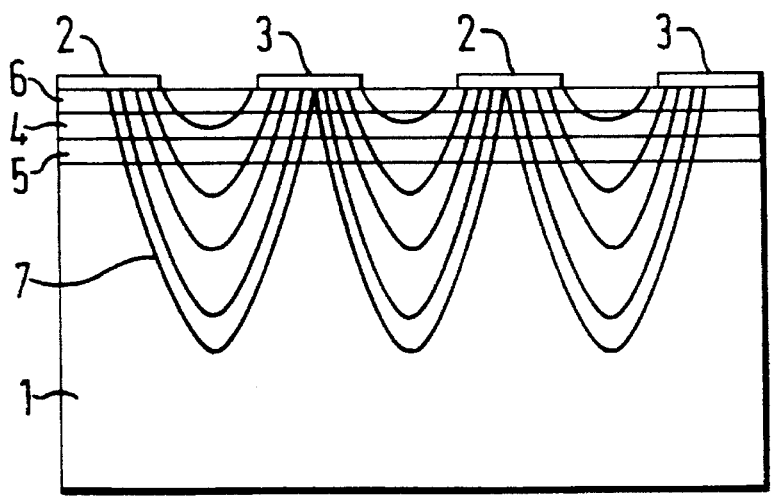
FIG. 3 is a schematic sectional view of a MSM device, which has been used to explain a prior art MSM photodiode, and which also will be used hereinafter to explain an MSM Photoconductor in accordance with the invention.
Figure 4A:
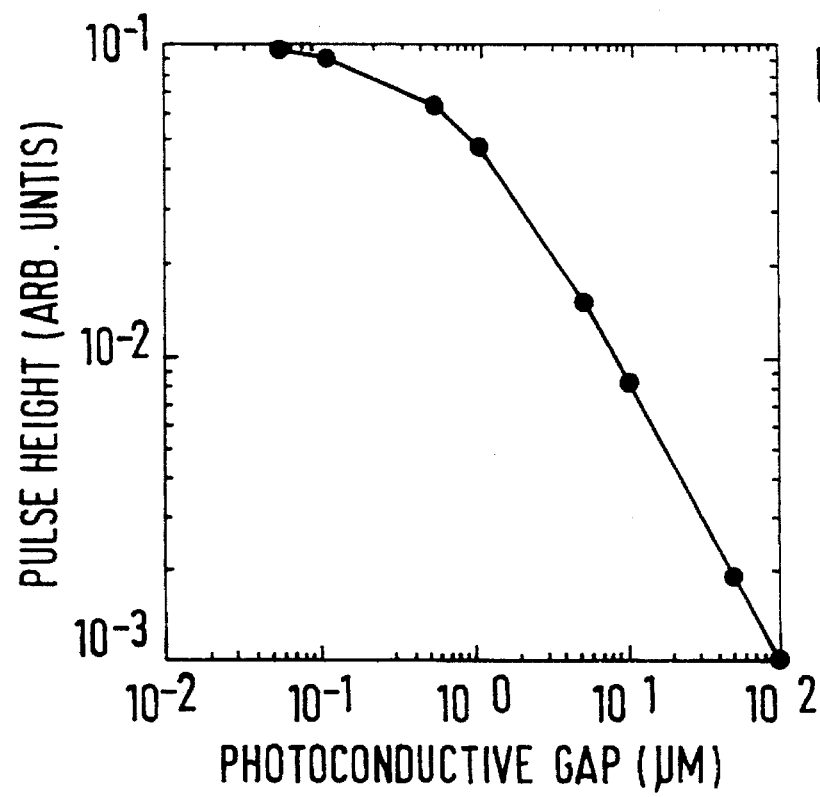
FIG. 4A and 4B illustrate graphs based upon our research work, discussed hereinbefore.
Figure 4B:
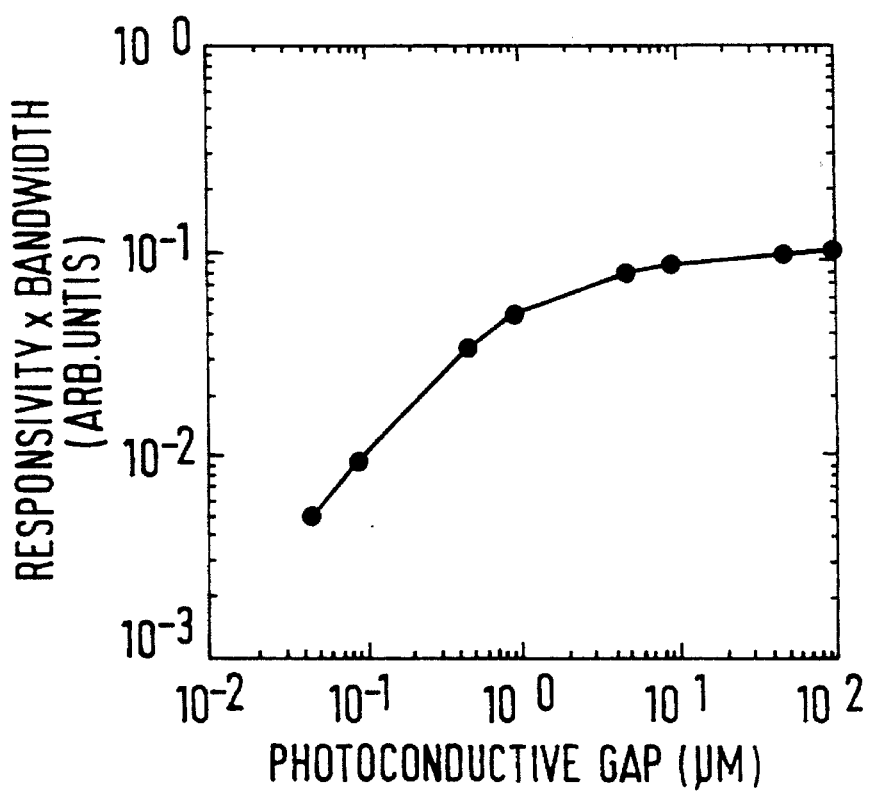

The first embodiment of the invention will now be described with reference to FIG. 3. Although this Figure has previously been used to describe a prior art MSM photodiode, the drawing can also be used to describe an example of the present invention. In the embodiment of the invention, the device comprises a MSM photoconductor (rather than the prior art photodiode). Thus, in the embodiment of the invention, the electrodes 2 and 3 form a contact with an ultrafast photoconductive substrate 1. The absorption layer 4 is disposed in an optical cavity defined by layers 5 and 6. Thus, incoming light passes through layer 6 and layer 4, is reflected from the boundary between layers 4 and 5 and thereafter is at least in part reflected at the boundary between layers 4 and 6, so as to resonate back and forth across the layer 4. Accordingly, the efficiency of photocarrier generation in the layer 4 is enhanced. Such a structure is known as a Fabry-Perot etalon and suitable structures will be apparent to those skilled in the art. For example, the layers 5 and 6 can be formed as multiple dielectric layers, for example, alternating thin layers of AlGaAs/GaAs or other suitable heteroepitaxial system. Thus, a typical example of the device according to the invention comprises an i-GaAs substrate 1, with the layers 5 and 6 being formed as a quarter wave stacks comprising multiple layers of GaAs/AlAs, and the layer 4 comprising an ultrafast photoconductive material such a LT GaAs, etc. In a typical structure designed for a wavelength of 0.8 μm, layers 5 and 6 consist of 25 periods of 60nm GaAs/65 nm AlAs, and layer 4 of 500 nm of LT GaAs. Alternatively, the upper reflector of the optical cavity, layer 6, may be formed by a post-growth dielectric stack, fabricated, for example by, electron-beam evaporation. A wide range of dielectrics such as $SiO_2$, $TiO_2$, etc., is available with refractive index varying from 1.26 ($CaF_2$) to 3.5 (Si), allowing tailoring of the optical cavity to the wavelength of choice. The field lines through the region 4 are shown at 7. It can be seen that the photo-generated carriers are thus produced close to the electrodes 2 and 3 in a region of relatively uniform, high field, thereby improving the responsivity of the device. Carriers are not produced deep into the substrate 1.

Figure 2:
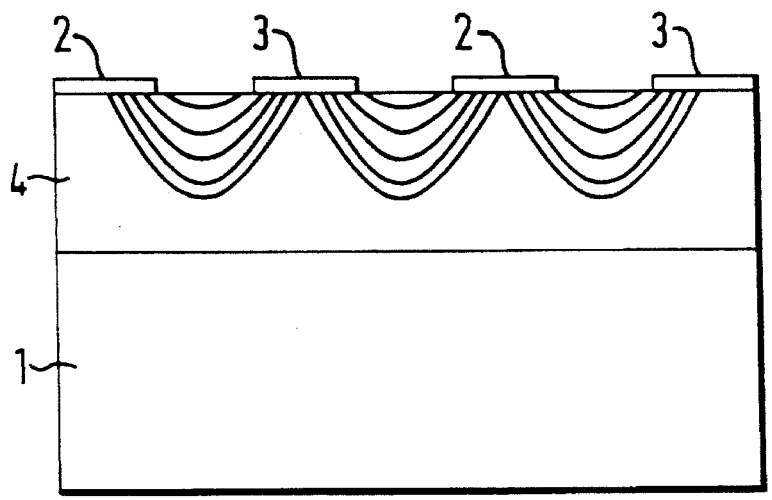
FIG. 2 is a schematic sectional view of the device shown in FIG. 1.
Figure 5:
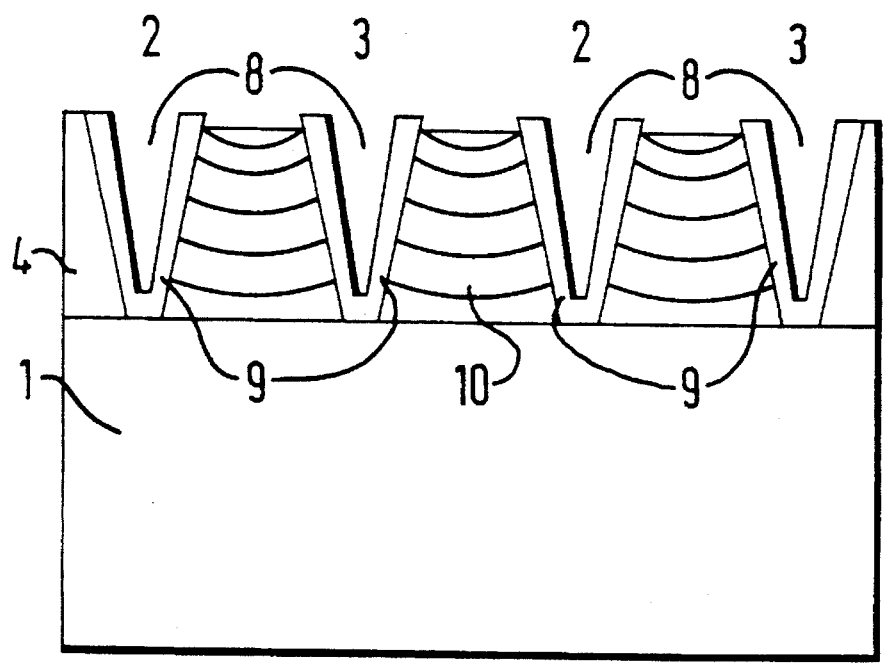
FIG. 5 is a sectional view through a second embodiment of the invention.

Another embodiment of the invention will now be described with reference to FIG. 5. Considering the photodectector shown in FIG. 2, the field strength in the absorption layer 4 is spatially non-uniform which degrades performance. This applies both to photoconductors and photodiodes. FIG. 5 shows an arrangement in which the field in the absorption layer 4 is rendered more uniform. Instead of the electrodes being applied to an upper continuous surface of the substrate 1, troughs in the form of V-shaped grooves 8 are formed in the absorption layer 4 by etching, and a contact metallisation 9 is formed on the side walls of the grooves to form the electrodes 2 and 3. The resulting field between the electrodes 2 and 3 shown by the field lines 10 illustrate that the metallisation on the side walls of the grooves form almost parallel plate capacitors with a substantially uniform field strength extending through the absorption layer 4. As a result, the responsivity-bandwidth is increased. The configuration shown in FIG. 5 is applicable both to photodiodes and photoconductors. For a photodiode, the metallisation 9 forms a Schottky contact with the intrinsic semiconductor layer 4 whereas for a photoconductor, the layer 4 is an ultrafast photoconductive material.

Figure 6:
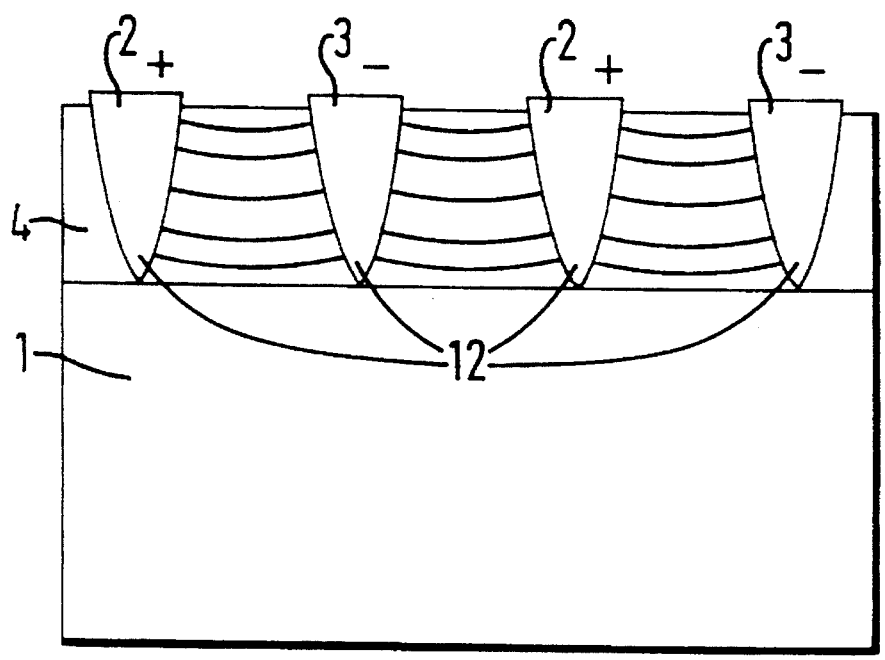
FIG. 6 is a sectional view through a third embodiment of the invention.

A similar effect can be achieved using implanted contacts as shown in FIG. 6. In this arrangement, the planar surface of the substrate 1 is maintained and instead of forming grooves, heavily doped regions 12 are formed deep into the layer 4, for example by ion implantation to form deep conducting contacts. The field configuration 10 is similar to that shown in FIG. 5. Again, the device can be used both for photoconductors and photodiodes. In the case of photodiodes, alternate fingers are doped P+ and $N^+$, so as to form lateral $P^+IN^+$ diodes. A contact metallisation (not shown) is applied to the upper surface of the regions 12 to form external connections.

It will be appreciated that the configurations described with reference to both FIGS. 5 and 6 can be used in combination with an optical resonant cavity as described hereinbefore with reference to FIG. 3.

Figure 1:
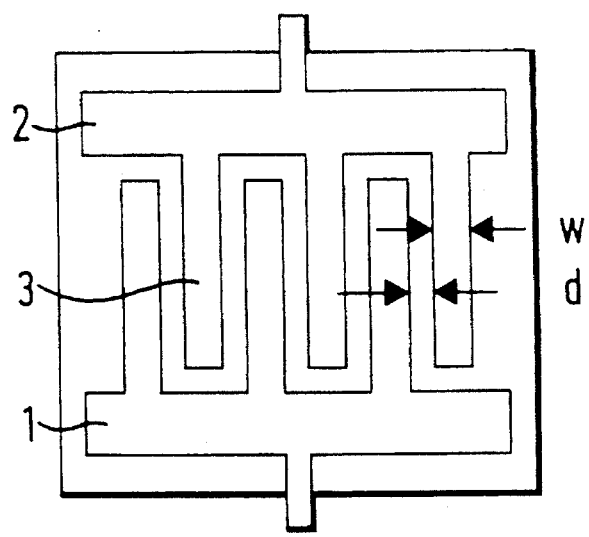
FIG. 1 is a schematic view of a MSM device.
Figure 7A:
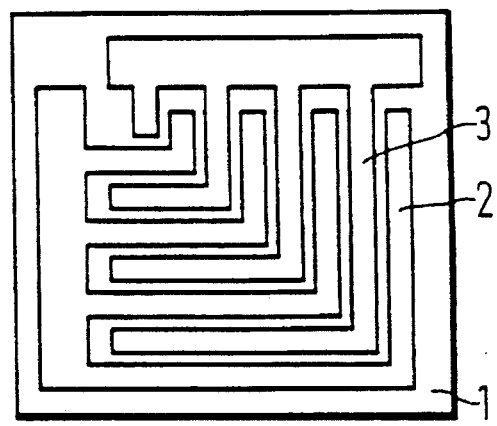
FIG. 7a, b, c illustrate different examples, in plan view, of electrode configurations which are polarisation-insensitive.
Figure 7B:
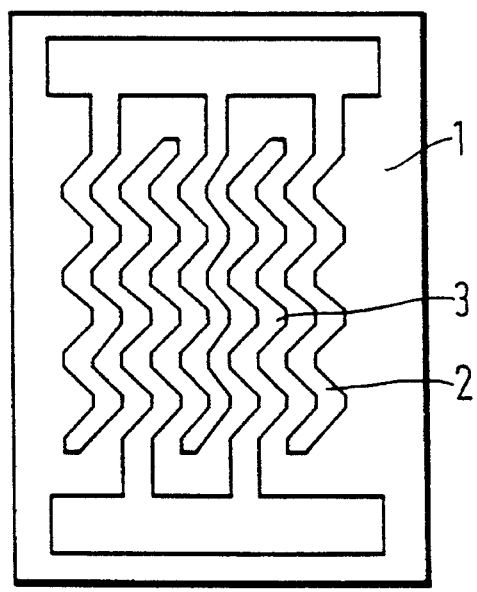
Figure 7C:
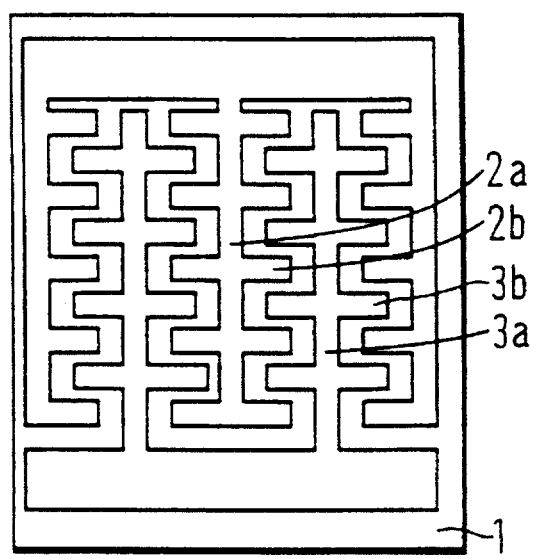

As previously described, it has been found that a configuration of electrodes as shown in FIG. 1 exhibits a sensitivity to polarisation of incoming light. It is postulated that the linear array of electrodes produces polarisation sensitivity in the manner of a diffraction grating, due to the electrode spacing (≈ μm) being comparable to the wavelength of light. This,gives rise to a non-linear response. Solutions to this problem are shown in FIG. 7a, 7b and 7c in which the two interdigitated sets of electrodes 2 and 3 are arranged to include portions which extend in mutually transverse directions, so as to desensitise the response of the device to the polarisation direction of the incoming optical radiation. Referring to FIG. 7a, each of the electrodes 2 and 3 are of an L-shaped configuration with portions extending in mutually orthogonal directions. The length of each orthogonal portion for a particular electrode is the same. Thus, the electrode has a polarisation sensitivity which comprises the sum of two equal mutually orthogonal polarisation sensitivities, which substantially reduces the overall polarisation sensitivity of the device since, irrespective of the angle of polarisation of the incoming light, the electrode will exhibit a substantially constant sensitivity.

An alternative configuration is shown in FIG. 7b in which the electrodes 2 and 3 have serpentine configurations and the effect of the sum of the mutually orthogonal components results in an arrangement which is substantially insensitive to the polarisation of incoming light.

Yet another arrangement is shown in FIG. 7c in which the electrodes 2 and 3 each include a main parallel trunk, for example trunk 2a with orthogonally extending branches 2b. The mutually orthogonal components result in a reduction of the polarisation sensitivity. Many other geometrical configurations will be apparent to those skilled in the art.

Figure 8A:
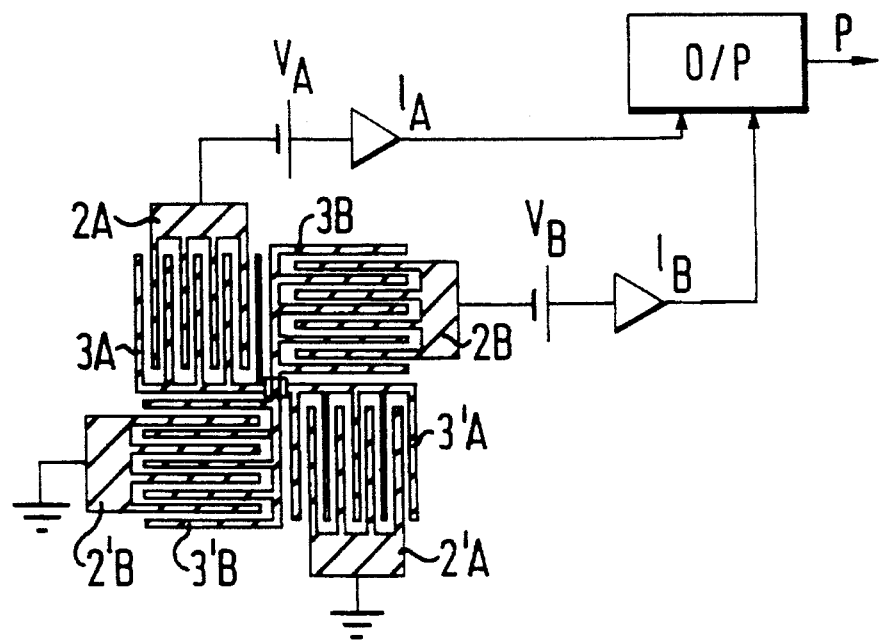
FIG. 8a and 8b illustrate a polarisation sensitive amplitude insensitive detector.

Further examples of MSM detectors will now be described which can distinguish between changes in polarisation and intensity of incident light. For use in an optical communication or computing system which employs polarisation as the carrier of information, it is necessary to produce a signal which is polarisation-dependent, but not dependent on the total light intensity (within limits set by the detection and saturation limits of the detector). This can be achieved using a interdigitated MSM detector as shown in FIG. 8a.

Four linear interdigitated MSM detectors are disposed in quadrants of a square, such that the orientation of the interdigitated fingers in adjacent quadrants is orthogonal. Thus, four pairs of interdigitated electrodes 2 and 3 are provided, as shown and diagonally-opposite pairs of detectors are connected and biased, such that the MSM detectors with fingers in one orientation are biased with voltage $V_A$ and produce a photocurrent $I_A$, whereas the MSM detectors with fingers in the orthogonal orientation are biased with voltage $V_B$ and produce a photocurrent $I_B$. Using standard transimpedance amplifiers, differential amplifiers and summing amplifiers, the quantities $(I_A-I_B)$ and $(I_A-I_B)$ can be obtained, and the normalised (intensity-independent) polarisation signal is given by $$p=(I_A-I_B)/(I_A=I_B).$$

Figure 8B:
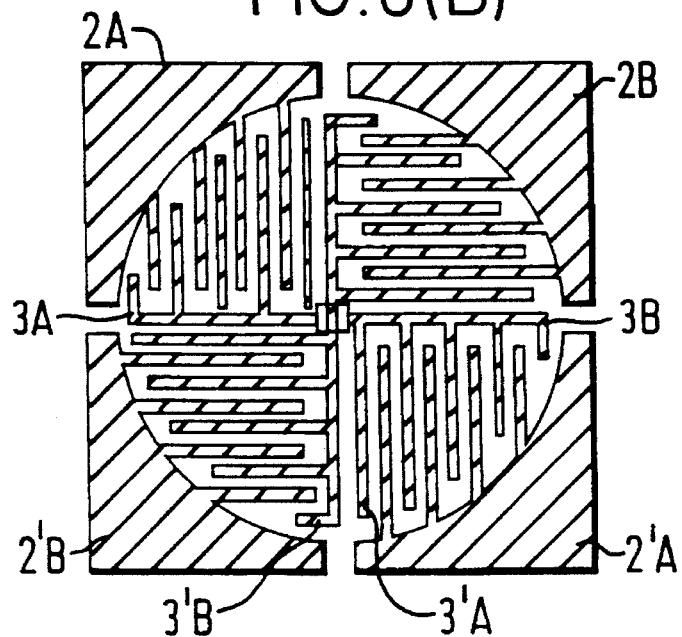

The two metallic contacts joining the diagonally-opposite pairs of detectors must be insulated from each other by an interelectrode insulating layer, such as silicon nitride, polyimide, etc., so that the detector is fabricated in three stages: electrode A, interelectrode insulator, electrode B. FIG. 8b shows such a detector in which the geometry has been optimised for detection of a circular light beam of a given size.

Figure 9A:
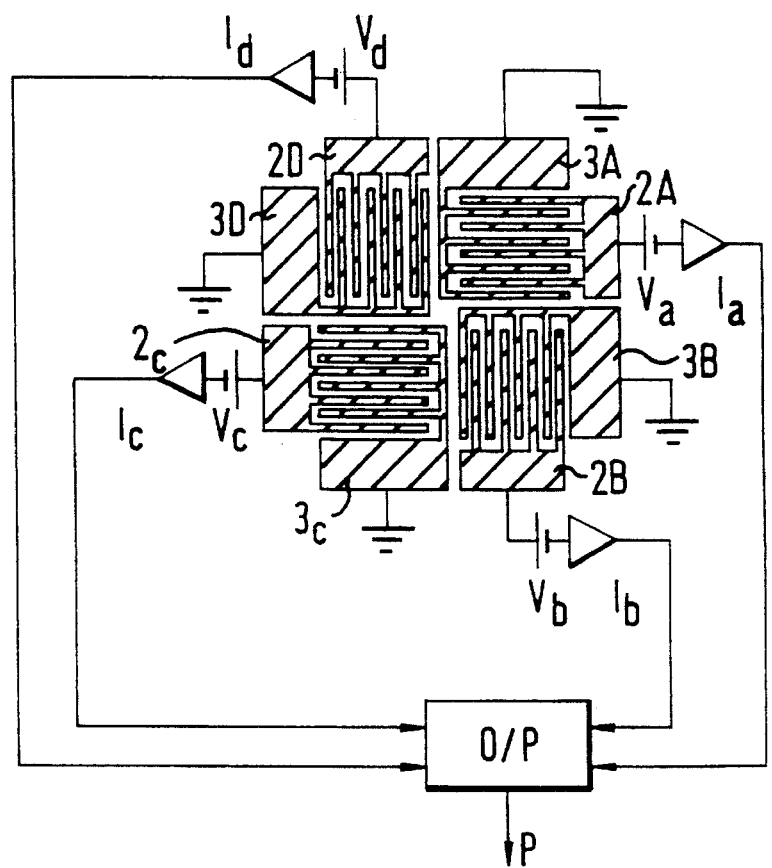
FIG. 9a and 9b illustrate another form of polarisation sensitive detector.

In a variation shown in FIG. 9a, diagonally-opposite pairs of detectors are not connected. Instead, each of the four quadrants a, b, c and d are independently biased and the photocurrents $I_a$, $I_b$, $I_c$ and $I_d$ are obtained. The polarisation is then given by:

$$p=((I_a+I_c))-(I_b+I_d))/(I_a+I_b+I_c+I_d)$$

Figure 9B:
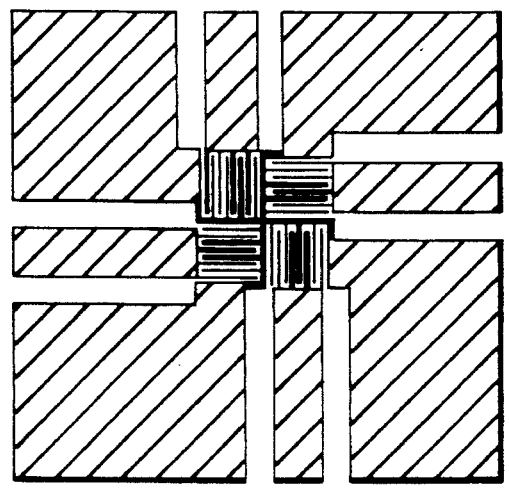

FIG. 9b shows another variation integrated into coplanar waveguide for fast signal propagation. Such a structure is suitable for planar integration with FET's to form an ultrafast polarisation-detection circuit.

It will be appreciated that the electrode configurations of FIG. 7a, 7b, 7c, 8aa 8b, 9a, or 9b can be used with any of the embodiments described with reference to FIGS. 3, 5 and 6.

I claim:

1. A metal-semiconductor-metal MSM photoconductor device comprising:

a photoconductive region for generating charge carriers in response to incoming optical radiation, an array of electrodes for applying an electric field to the photoconductive region so as to collect charge carriers produced in response to the incoming radiation, and means defining an optical resonant cavity containing the photoconductive region, whereby incoming optical radiation resonates in the cavity to generate said carriers.

2. A MSM photoconductor device according to claim 1 including a substrate, said photoconductive region comprising a layer overlying the substrate, said cavity being defined by first and second optically reflective layers on opposite sides of the photoconductive layer, and the array of electrodes comprising first and second sets of interdigitated electrodes overlying the photoconductive layer.

3. A metal-semiconductor-metal (MSM) detector comprising:

a substrate, a photoconductive layer overlying substrate for generating charge carriers in response to incoming radiation, and electrode means to receive carriers from the photoconductive layer produced by the incoming radiation, said electrode means comprising electrically conductive regions extending into the thickness of the photoconductive layer for establishing an electric field through the layer between the conductive regions.

4. A MSM detector device according to claim 3, wherein the photoconductive layer consists of an ultrafast photoconductive material electrically contacted by the conductive regions of the electrodes.

5. A MSM detector device according to claim 3, including troughs formed in the photoresponsive layer, said conductive regions comprising metallisation formed in the troughs.

6. A MSM detector device according to claim 5, wherein said troughs are generally V-shaped in transverse cross section and said metallisation is formed on the side walls thereof.

7. A MSM detector device according to claim 3, wherein said electrically conductive regions comprise implanted conductive regions formed in the layer.

8. A MSM detector device according to claim 7, wherein said implanted regions are formed by ion implantation.

9. A MSM detector according to claim 3, including means defining an optical resonant cavity containing the photoresponsive layer, whereby incoming optical radiation resonates in the cavity to generate said carriers.

10. A metal-semiconductor-metal (MSM) detector device comprising:

a photoresponsive region for generating charge carriers in response to incoming optical radiation, and electrode means to receive carriers from the photoresponsive region produced by the incoming radiation, said electrode means comprising first and second interdigitated sets of electrodes, the electrodes of at least one of sets including portions which extend in mutually transverse directions whereby to desensitize the response of the device to the polarization of the incoming radiation.

11. A MSM detector device according to claim 10, wherein the electrodes of each set thereof each include a portion extending in a first direction and a portion extending in a second orthogonal direction.

12. A MSM detector device according to claim 11, wherein each of the electrodes is of a generally L-shaped configuration.

13. A MSM detector device according to claim 11, wherein each of the electrodes is of a generally serpentine configuration.

14. A MSM detector device according to claim 11, wherein said electrodes include parallel main trunks, and branches extending transversely from the main trunks.

15. A MSM detector device according to claim 10, including means defining an optical resonant cavity containing the photoresponsive region, whereby incoming optical radiation resonates in the cavity to generate said carriers.

16. A MSM detector device according to claim 10, wherein the photoresponsive region comprises a layer overlying a substrate, and the electrode means comprise electrically conductive regions extending into the thickness of the photoresponsive layer for establishing an electric field through the layer between the conductive regions.

17. A metal-semiconductor-metal (MSM) detector device comprising:

a photosensitive region for generating charge carriers in respect to incoming radiation, and electrode means to receive carriers from the photoresponsive region produced by the incoming radiation, said electrode means comprising a plurality of sets of interdigitated electrodes interconnected to provide an output which is sensitive to the polarization of incoming radiation but substantially insensitive to the intensity thereof at least over a given intensity range.

18. A MSM device according to claim 17 including four of said sets of interdigitated electrodes, arranged in quadrants of an area having a symmetrical quadrilateral periphery, diagonally opposite pairs of the set being interconnected with their electrodes extending in the same directions, and amplifier means for providing an output which is a ratio of the sum and difference of the signals produced by said pairs.

19. A MSM detector according to claim 17, including means defining an optical resonant cavity containing the photoresponsive region, whereby incoming optical radiation resonates in the cavity to generate said carriers.

20. A MSM detector according to claim 17 wherein the photoresponsive region comprises a layer overlying a substrate, and the electrode means comprise electrically conductive regions extending into the thickness of the photoresponsive layer for establishing an electric field through the layer between the conductive regions.

* * * * *

UNITED STATES PATENT AND TRADEMARK OFFICE
CERTIFICATE OF CORRECTION

PATENT NO. : 5,512,763

DATED : April 30, 1996

INVENTOR(S) : Jeremy ALLAM et al.

It is certified that error appears in the above-identified patent and that said Letters Patent is hereby corrected as shown below:

| Column | Line | |
|---|---|---|
| 2 | 12 | Change "Lett" to --Lett.--. |
| 2 | 51 | Delete "25". |
| 3 | 26 | Change "$N(z)=N_o.exp(=\alpha z).$" to --$N(z)=N_o.exp(-\alpha z).$--. |
| 3 | 35 | Change "Widths" to --widths--. |
| 3 | 40 | After "4b" delete ")" insert --,--. |
| 4 | 15 | After "Ohmic" insert --contacts--. |
| 4 | 64 | Change "FIG." to --FIGS.--. |
| 5 | 3 | Change "FIG. 7a,b,c" to --FIGS. 7a, b & c--. |
| 5 | 5 | Change "FIG." to --FIGS.--. |

UNITED STATES PATENT AND TRADEMARK OFFICE
CERTIFICATE OF CORRECTION

PATENT NO.   : 5,512,763
DATED        : April 30, 1996
INVENTOR(S)  : Jeremy ALLAM et al.

It is certified that error appears in the above-identified patent and that said Letters Patent is hereby corrected as shown below:

| Column | Line | |
|---|---|---|
| 5 | 7  | Change "FIG." to --FIGS.--. |
| 5 | 44 | Change "example by," to --example, by--. |
| 6 | 31 | Change "This,gives" to --This gives--. |
| 6 | 32 | Change "FIG." to --FIGS.--. |
| 7 | 12 | Change "$(I_A-I_B)$ (second occurrence) to --$(I_A+I_B)$--. |
| 7 | 16 | Change "$p=(I_A-I_B)/(I_A=I_B)$." to --$p=(I_A-I_B)/(I_A+I_B)$.--. |
| 7 | 39 | Change "8aa" to --8a,--. |

Signed and Sealed this

Third Day of September, 1996

Attest:

BRUCE LEHMAN

Attesting Officer    Commissioner of Patents and Trademarks